(12) United States Patent
Wu et al.

(10) Patent No.: US 6,855,984 B1
(45) Date of Patent: Feb. 15, 2005

(54) PROCESS TO REDUCE GATE EDGE DRAIN LEAKAGE IN SEMICONDUCTOR DEVICES

(75) Inventors: Zhiqiang Wu, Plano, TX (US); Shaoping Tang, Plano, TX (US); Song Zhao, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/697,510

(22) Filed: Oct. 30, 2003

(51) Int. Cl.[7] .................................... H01L 29/76
(52) U.S. Cl. ................ 257/335; 257/336; 257/E21.618
(58) Field of Search ............................... 257/335, 336, 257/E21.618

(56) References Cited

U.S. PATENT DOCUMENTS

| 6,057,184 A | 5/2000 | Brown et al. |
| 6,097,068 A | 8/2000 | Brown et al. |
| 6,410,410 B1 * | 6/2002 | Feudel et al. ............... 438/547 |
| 6,509,586 B2 * | 1/2003 | Awano ....................... 257/192 |

\* cited by examiner

Primary Examiner—David Nelms
Assistant Examiner—Tu-Tu Ho
(74) Attorney, Agent, or Firm—Jacqueline J. Garner; W. James Brady, III; Frederick J. Telecky, Jr.

(57) ABSTRACT

The present invention employs a no mask, blanket implant of an n-type implant after formation of active regions in NMOS devices. As a result, the implanted n-type dopants counteract portions of strongly p-type HALO or pocket regions creating a smoother dopant profile or transition from a portion of the active regions to the channel. However, the blanket implant is performed at a relatively low energy so as to not significantly alter one or more other portions of the active regions to other portions of the device.

9 Claims, 13 Drawing Sheets

PROCESS TO REDUCE GATE EDGE DRAIN LEAKAGE IN SEMICONDUCTOR DEVICES

FIELD OF THE INVENTION

The present invention relates generally to semiconductor devices, and more particularly, to systems and methods to reduce gate induced drain leakage in semiconductor devices.

BACKGROUND OF THE INVENTION

There exists a continuing need for electronic and computer devices to operate at faster speeds, with lower power, and smaller size. In particular, portable devices (e.g., personal digital assistants, mobile telephones, digital audio, and the like) rely on low power operation to improve battery life. However, these needs can be at odds with each other. For example, achieving lower power can, in some instances, prevent speed improvements of the device.

Size, performance, and power consumption of semiconductor devices are important to achieving the above goals for electronic and computer devices. Semiconductor devices (e.g., integrated circuits) are comprised of a number of components or devices. The size, performance, and power goals can be attained by further reducing component size while increasing the number of components present on the device. Generally, semiconductor devices are reduced in size by shrinking feature sizes and device dimensions. The number of components are increased, also referred to as density, and tracked by integration levels. However, scaling or shrinking semiconductor devices can have negative consequences, such as increased power loss due to, for example, increased leakage. With respect to semiconductor transistor devices, these devices are under constant pressure to reduce channel length as a mechanism to shrink device size. However, reducing the channel length requires increased channel doping levels to achieve a suitable threshold voltage. But, the increased doping levels can also cause increased leakage.

What is needed are systems and methods of fabrication that create scalable semiconductor transistor devices without substantially increasing low power standby leakage.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by reducing low power standby leakage in transistor devices. The present invention accomplishes the lower power standby leakage reduction while mitigating short channel effects by modifying an active interface between source/drain regions and a channel region and well region. By so doing, semiconductor devices of the present invention can be reduced in size without a substantial corresponding increase in low power standby leakage and short channel effects.

The present invention employs a no mask, blanket implant of an n-type dopant implant after formation of active regions in NMOS devices. As a result, the implanted n-type dopants counteract portions of p-type or strongly p-type HALO or pocket regions creating a smoother dopant profile or transition, from the active regions to the channel. However, the blanket implant is performed at a relatively low energy so as to not significantly alter a lower portion of the dopant profile the active regions to lower portions of the well. Furthermore, the blanket implant permits a surface portion of the active interface to have a relatively sharp dopant transition profile.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
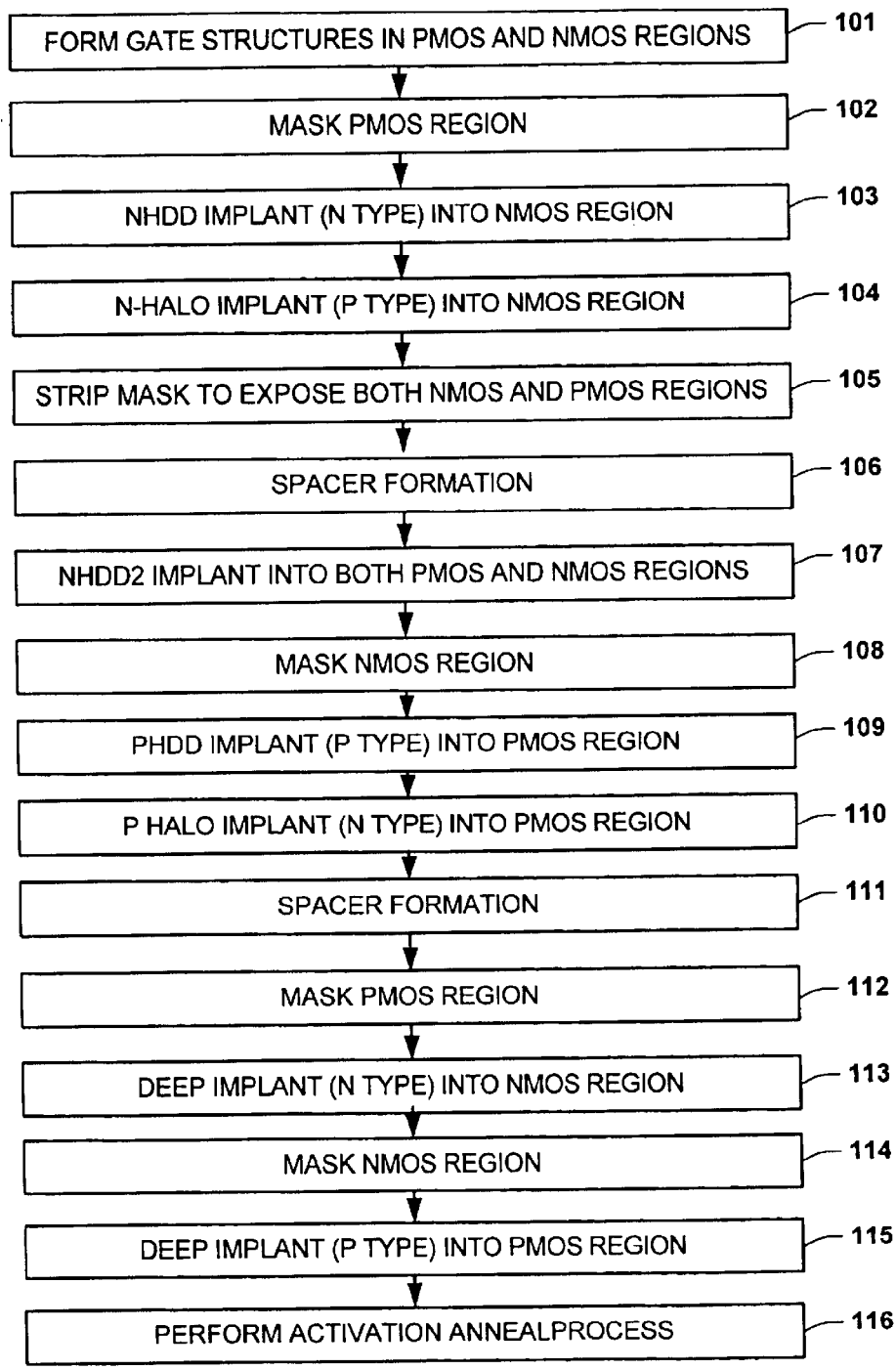
FIG. 1 is a flow diagram illustrating a method of fabricating a semiconductor device in accordance with an aspect of the present invention.

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

Low power applications can desire semiconductor transistors that have low standby leakage. Several components affect low standby leakage including, but not limited to, subthreshold current (Isub), gate edge drain leakage (Igdl) which include gate induced drain leakage (Igidl) and drain to channel diode leakage which is not controlled by gate voltage, and gate current (Igate). At relatively low leakage requirements, the gate edge drain leakage current becomes a significant portion of the total standby leakage. Thus, reducing the gate edge drain leakage advantageously reduces the total low power standby leakage.

However, as channel lengths are shortened in order to shrink device sizes, channel and well regions require higher levels of doping and/or pocket implants in order to mitigate short channel effects. A sharp dopant profile transition is created from the active regions to a channel region (e.g., going from strong n-type to strong p-type). However, one of the factors affecting gate edge drain leakage is the sharpness, defined as a magnitude of change from one conductivity type to another, of the active region to well interface. Generally, the sharper the interface, the higher the e-field (electric field) and therefore the higher the gate edge drain leakage. Yet, in order to build short channel length devices, drain extension regions should be sharp in order to reduce short channel effects, as described above.

The present invention facilitates semiconductor device fabrication by reducing low power standby leakage in transistor devices. The present invention accomplishes the lower power standby leakage while mitigating short channel effects by modifying an active interface between source/drain regions and a channel region and well region. By so doing, semiconductor devices of the present invention can be reduced in size without a substantial corresponding increase in low power standby leakage and short channel effects.

The present invention employs a no mask, blanket implant of an n-type implant after formation of active regions in NMOS devices. As a result, the implanted n-type dopants counteract portions of strongly p-type HALO or pocket regions, thereby creating a smoother dopant profile or transition for a central portion of the active interface from the active region(s) to the channel. However, the blanket implant is performed at a relatively low energy so as to not significantly alter a lower portion of the active interface. Other processing steps can modify the lower portion if desired.

Turning now to FIG. 1, a flow diagram is provided that illustrates a method 100 of fabricating a semiconductor device in accordance with an aspect of the present invention. The method 100 fabricates a semiconductor device having a relatively low standby leakage by creating a relatively smooth active region interface, yet mitigating short channel effects. As a result, the device can be well suited for low power applications and can be scaled. FIGS. 2–9, described in detail infra, serve to further illustrate the method 100 by depicting the semiconductor device at various stages of fabrication. Thus, FIGS. 2–9 are described in conjunction with the method 100 of FIG. 1.

The method begins at block 101 wherein gate structures are formed in PMOS and NMOS regions of the semiconductor device. Generally, the respective PMOS and NMOS regions are formed prior to the gate structures by implanting a selected dose and energy of one or more p-type dopants and one or more n-type dopants, respectively, forming wells in a substrate of the device to a selected depth and with a selected dopant profile. The gate structures can be formed by an appropriate selective masking operation that grows a gate oxide and deposits polysilicon material in the PMOS and NMOS regions and then selectively removes portions of the grown oxide and the deposited polysilicon material. As a consequence, a liner oxide can be formed blanketing the device at this stage. Continuing at block 102, the PMOS region is selectively masked (e.g., depositing resist, developing/selecting portions of the resist, and removing the selected portions of the resist) while leaving the NMOS region exposed.

Figure 2:
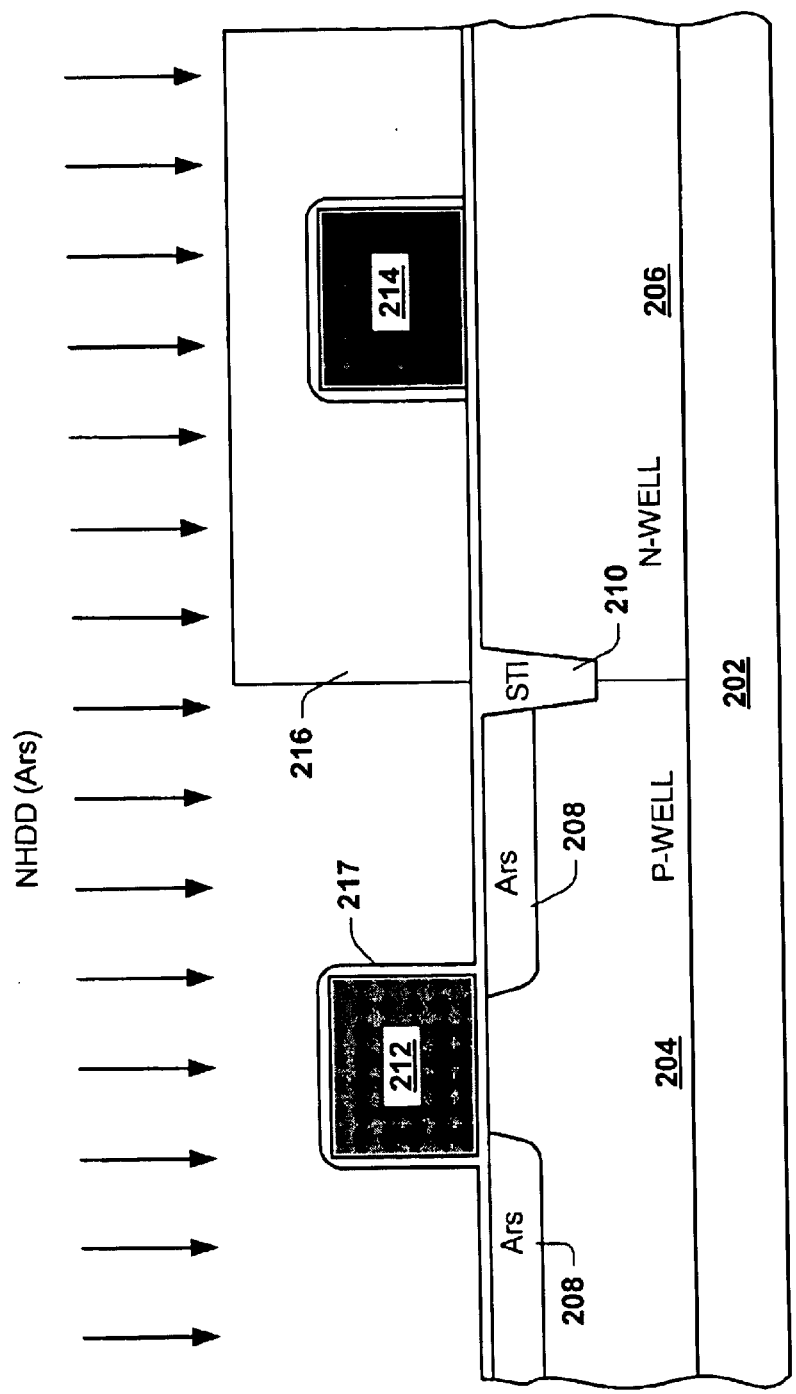
FIG. 2 is a block diagram illustrating the semiconductor device after gate structure formation in accordance with an aspect of the present invention.

Referring now to FIG. 2 in conjunction with FIG. 1, FIG. 2 is a block diagram illustrating the semiconductor device at this stage of fabrication, wherein gate structures have been formed and the PMOS region is masked. The p-well 204 and the n-well 206 are shown as being formed in the substrate 202 of the device. A shallow trench isolation region 210 separates the p-well 204 and the n-well 206, in this example. An NMOS gate structure 212 is formed within the NMOS region of the device and a PMOS gate structure 214 is illustrated as being formed in the PMOS region of the device. A layer of resist or a mask 216 is shown covering the PMOS region from the masking operation at block 102.

Figure 3:
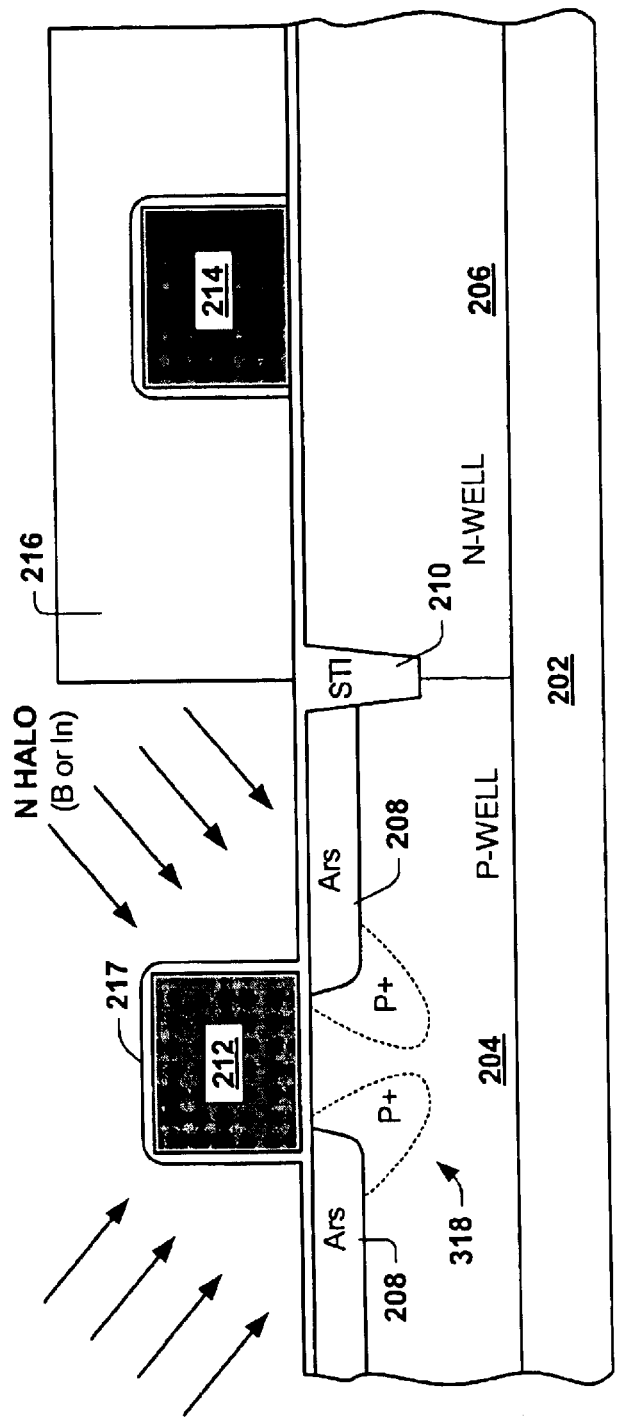
FIG. 3 is a block diagram illustrating a p-type HALO implant in accordance with an aspect of the present invention.

Turning to block 103 of FIG. 1, the method 100 continues by performing an n-type highly doped drain (NHDD) implant, referred to as a first NHDD implant, within the NMOS region, thereby forming active regions 208, also referred to as first NHDD regions, as shown in FIG. 2. The first NHDD implant is performed with one or more suitable dopants, such as arsenic (as shown), with a specific dose and energy. However, it is appreciated that other suitable n-type dopants can be employed. Subsequently, a p-type or p+-type HALO or pocket implant is performed at block 104 within the NMOS region. A suitable p-type dopant, such as boron, is used for the implant. Additionally, the implant is preferably performed non-perpendicular to the device surface (e.g., an angled implant) with a selected dose and selected energy. FIG. 3 is a block diagram of the semiconductor device further illustrating the p-type HALO implant in accordance with an aspect of the present invention. P-type pocket regions 318 are shown as being formed as a result of the p-type HALO implant of block 104.

Figure 4:
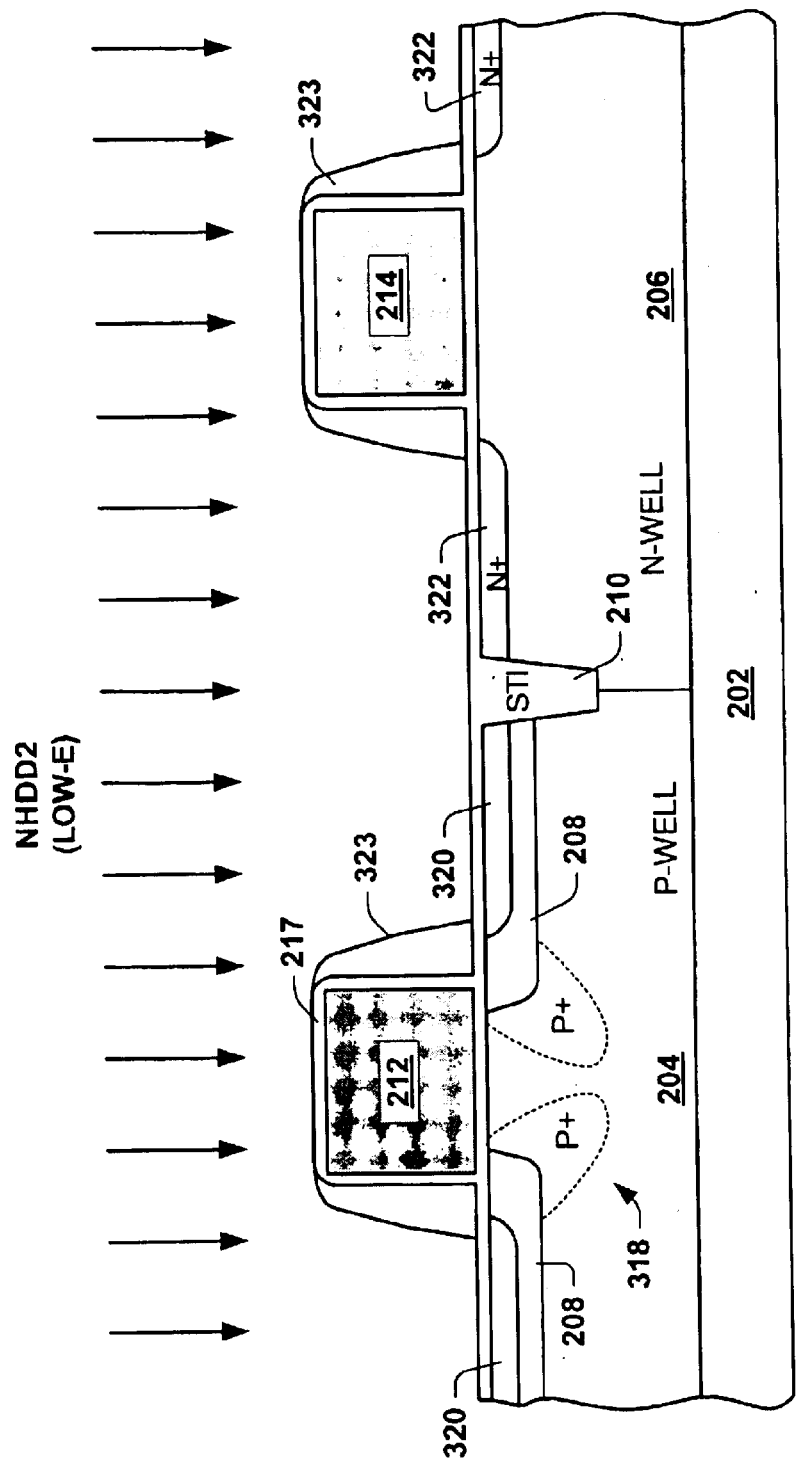
FIG. 4 is a block diagram illustrating the semiconductor after spacer formation in accordance with an aspect of the present invention.

The mask 216 is removed at block 105 in order to expose both the NMOS and PMOS regions. Then, sidewall spacers are formed at block 106 adjacent to the stacked gate 212 in the NMOS region and adjacent to the stacked gate 214 in the PMOS region. These sidewall spacers are typically comprised of oxide or another suitable insulative material or combination of multiple layers and are formed typically by a deposition followed by an anisotropic etch operation. Referring to FIG. 4, another diagram illustrating the semiconductor device after spacer formation in accordance with an aspect of the present invention is provided. The sidewall spacers 323 are shown formed adjacent to the stacked gates 214 and 212. A second highly doped drain (HDD) implant is then performed at block 107 and also illustrated in FIG. 4. The second HDD implant is a blanket implant (i.e., performed without a mask across the device) and forms second NHDD regions 320 within the p-well 204 of the NMOS region and forms N+ regions 322 within the n-well 206 of the PMOS region. A suitable n-type dopant such as phosphorous, arsenic, and fluorine is implanted with a relatively low energy such that the second implant is shallower than the first HDD implant. The second HDD implant is performed with a shallower implant range than the first HDD implant. Additionally, the concentration of the second NHDD regions 320 is typically about 1/100th to 1/10th that of the first NHDD regions 208. Furthermore, the dopant is selected and implanted such that it diffuses more easily than the dopant employed in the first HDD implant. As will be shown infra, this greater diffusivity allows migration of dopants that facilitate smoothing a central portion of an active region interface between the NHDD region 208 and the channel. As a result, n-type or neutral regions 320 are formed within the NMOS region and n-type or neutral regions 322 are formed within the PMOS region.

Figure 5:
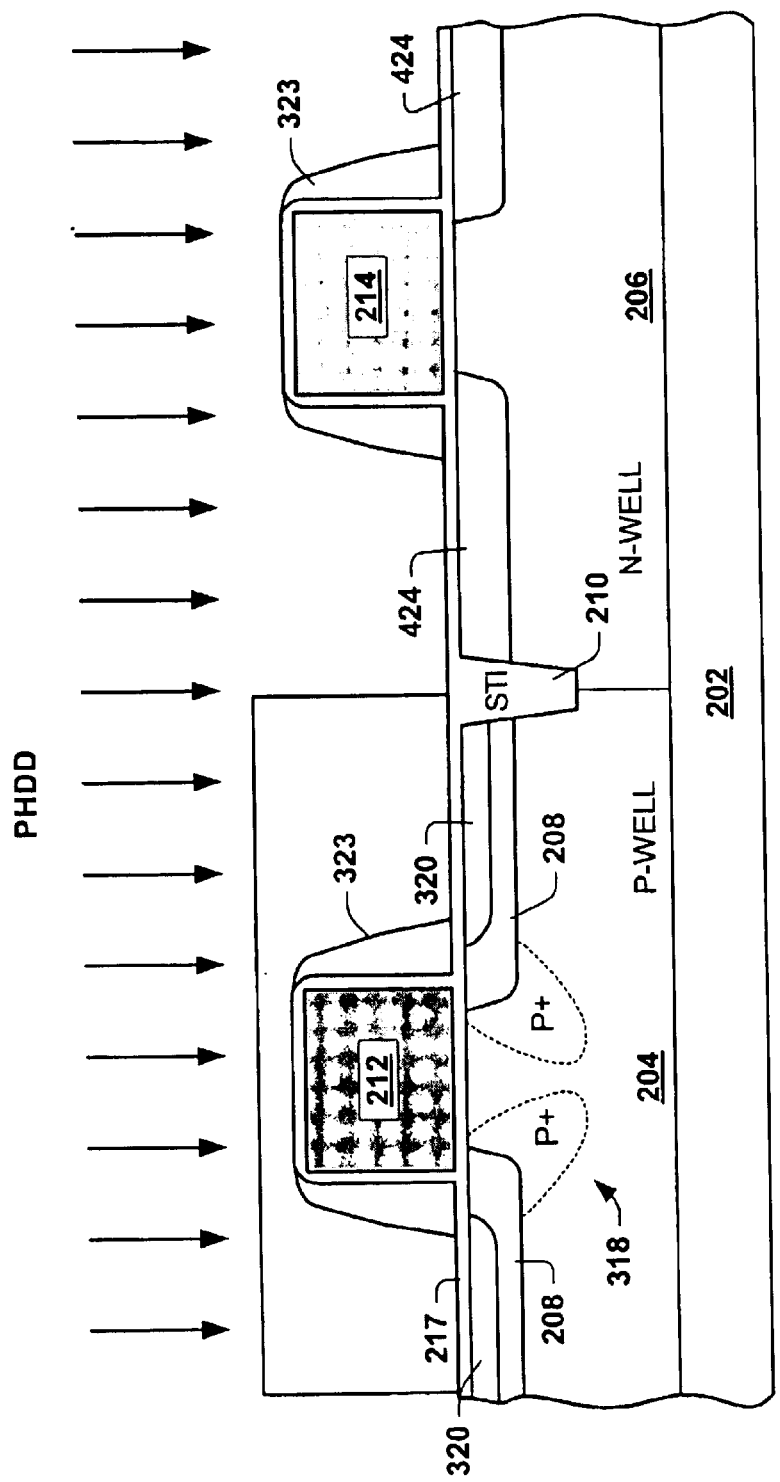
FIG. 5 is a block diagram illustrating the semiconductor device during PMOS active region formation in accordance with an aspect of the present invention.
Figure 6:
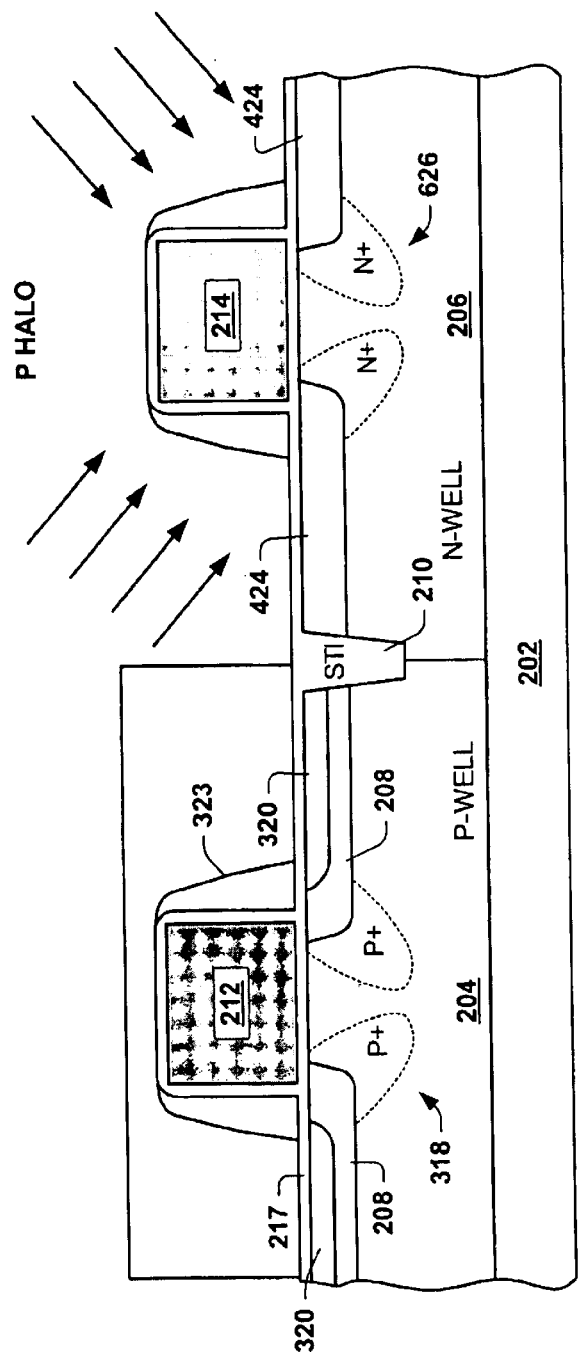
FIG. 6 is a block diagram illustrating the semiconductor device during n-type HALO formation in accordance with an aspect of the present invention.

Subsequent to the second HDD implant, the NMOS region is selectively masked at block 108 whereas the PMOS region is now exposed. A p-type highly doped drain (PHDD) implant is performed at block 109 by implanting a p-type dopant, such as boron, into the PMOS region. The implant is performed at a selected dose and energy in order to form PHDD regions 424 as depicted in FIG. 5, which is a diagram illustrating the semiconductor device during PMOS active region formation in accordance with an aspect of the present invention. Without removing the mask covering the NMOS region, an n-type HALO implant in the PMOS region is then performed at block 110. A suitable n-type dopant, such as phosphorous, is implanted at a non-perpendicular angle with a specific dose and energy at block 110. As a result, n-type pocket regions 626 are formed and depicted in FIG. 6, which is a diagram illustrating the semiconductor device during n-type pocket formation in accordance with another aspect of the present invention. During the implantation procedures of blocks 109 and 110, the n-type dopants or ions previously implanted diffuse significantly. As a result, the pocket regions 626 can also be partially comprised of dopants from the second HDD implant and previously located in regions 424 from FIG. 4. Because of this, short channel effects within the PMOS region can be mitigated.

Figure 7:
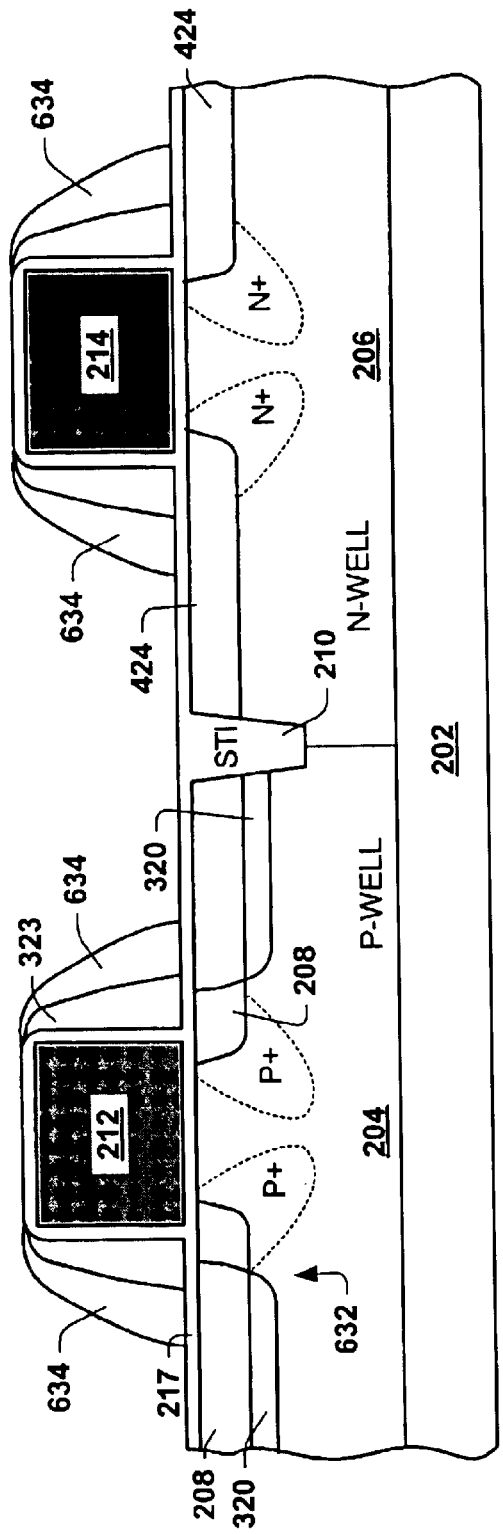
FIG. 7 is a block diagram illustrating formation of second sidewall spacers in accordance with an aspect of the present invention.

Continuing, the mask is removed from the NMOS region and second sidewall spacers 634 are formed at block 111. FIG. 7 is a diagram illustrating formation of the second sidewall spacers on the device in accordance with an aspect of the present invention. The second sidewall spacers are formed via a deposition-etch operation and are comprised of oxide, nitride, or a combination thereof. Furthermore, the second sidewall spacers 634 typically have a maximum thickness of about 300 to 1000 angstroms. In contrast, the first sidewall spacers 323 typically have a thickness of about 40 to 100 angstroms. However, it is appreciated that other suitable thicknesses can be employed for the spacers and still be in accordance with the present invention.

Figure 8:
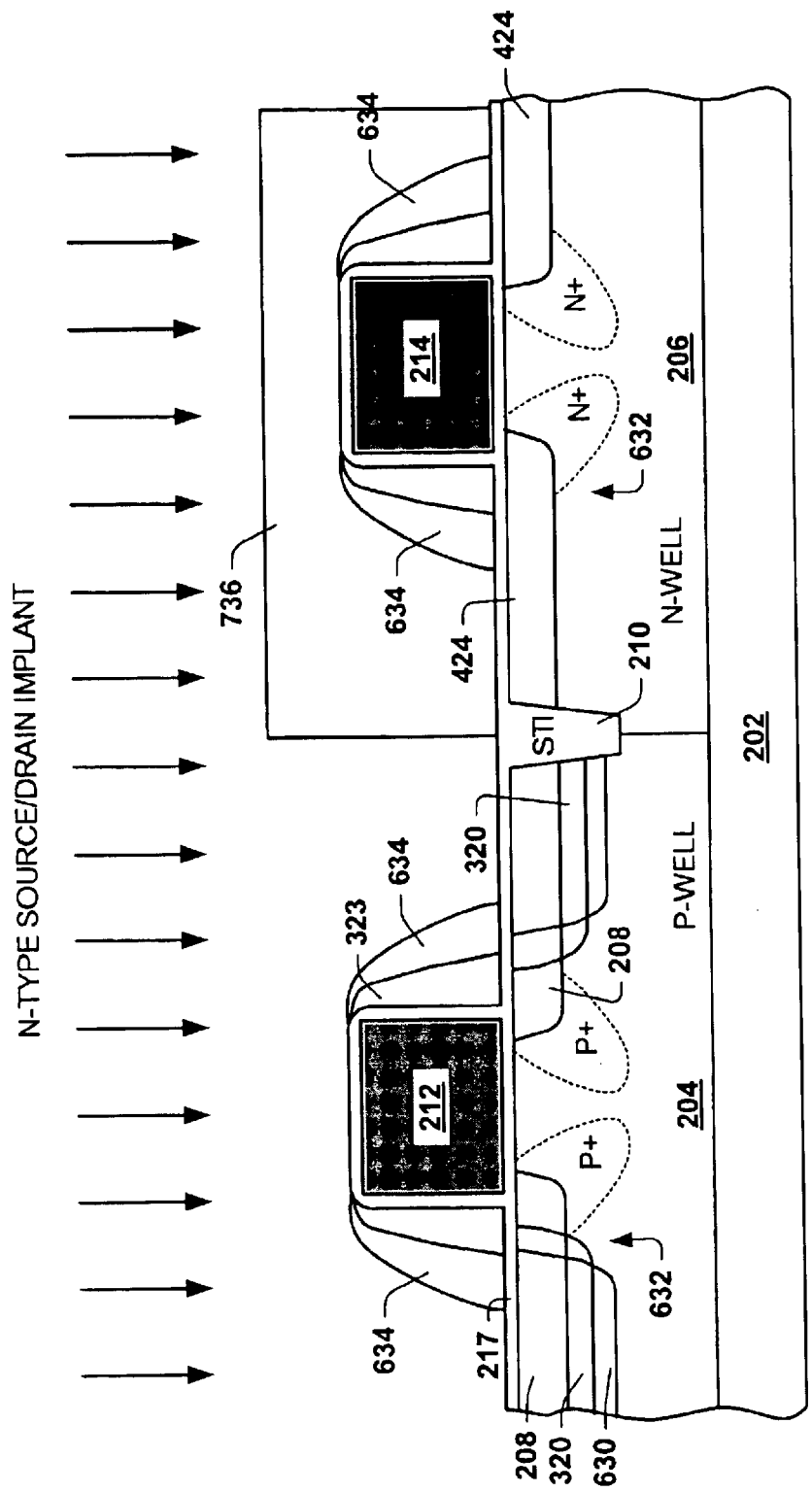
FIG. 8 is a diagram illustrating the semiconductor device during deep n-type implants in accordance with an aspect of the present invention.

Subsequently, the PMOS region is again masked at block 112 and a source/drain n-type implant is performed on the NMOS region at block 113. FIG. 8 is a diagram illustrating the device during the source/drain n-type implant in accordance with an aspect of the present invention. The implant is performed at a selected dose and energy, but the energy is relatively high compared with that used at block 103. As a result, source/drain regions 630 are formed within the NMOS region that extend below the active/extension regions 208. Additionally, dopants within the n-type or neutral regions 320 diffuse thereby smoothing the dopant profile at a central portion of the active region interface and permitting a relatively sharp dopant profile at a surface portion of the active region interface (e.g., about 200 Angstroms from the surface). The mask 736 can then be removed from the PMOS region. As an example, a typical magnitude of change for a relatively sharp transition could be about $1 \times 10^{20}/cm^3$ N-type to $1 \times 10^{18}/cm^3$ P-type for the first HDD region 208 to the channel junction, which results in a magnitude change of $1.01 \times 10^{20}/cm^3$. After smoothing, in this example, the change in magnitude can decrease to about $1 \times 10^{19}/cm^3$ N-type to $1 \times 10^{17}/cm^3$ P-type, which results in a magnitude of change of about $1.01 \times 10^{19}/cm^3$.

Figure 9:
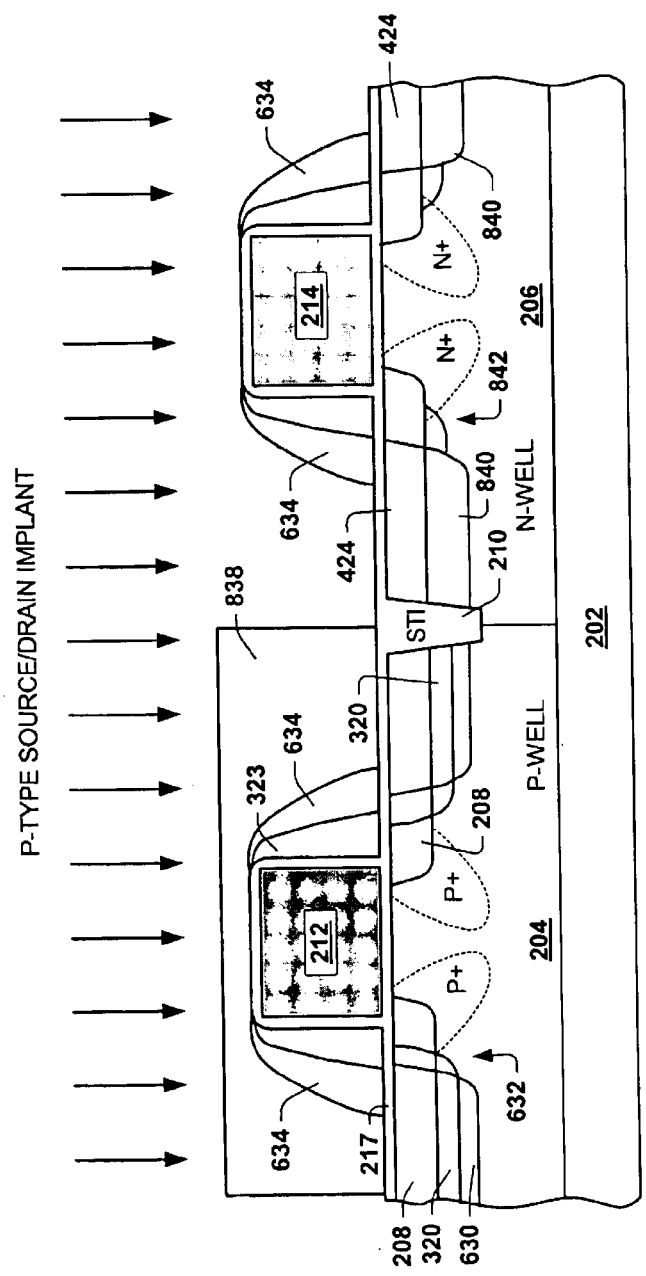
FIG. 9 is a diagram illustrating the semiconductor device during deep p-type implants in accordance with an aspect of the present invention.

The NMOS region is masked at block 114 and a source/drain p-type implant is performed within the PMOS region at block 115. FIG. 9 is a diagram illustrating the device during the source/drain implant in accordance with an aspect of the present invention. The implant is performed at a selected dose and energy, but the energy is relatively high compared with that used at block 107. As a result, source/drain regions 840 are formed within the PMOS region that extend vertically below the extension regions 424.

Continuing at block 116, an activation anneal process is performed on the device. Typically, the anneal process is a rapid thermal anneal (RTA) performed at a suitable temperature, such as about 1000 degrees Celsius. The activation anneal process facilitates dopant diffusion and activation of dopants within the source drain regions or second HDD regions 320, active regions or first HDD regions 208, and n-type regions 320 of the NMOS portion and within active regions 424 and second HDD regions 840 of the PMOS portion. Additionally, dopants within the n-type or neutral regions 424 diffuse altering a dopant profile of the N+ pocket regions 626. The mask 838 can then be removed from the NMOS region.

While, for purposes of simplicity of explanation, the method 100 of FIG. 1 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 10:
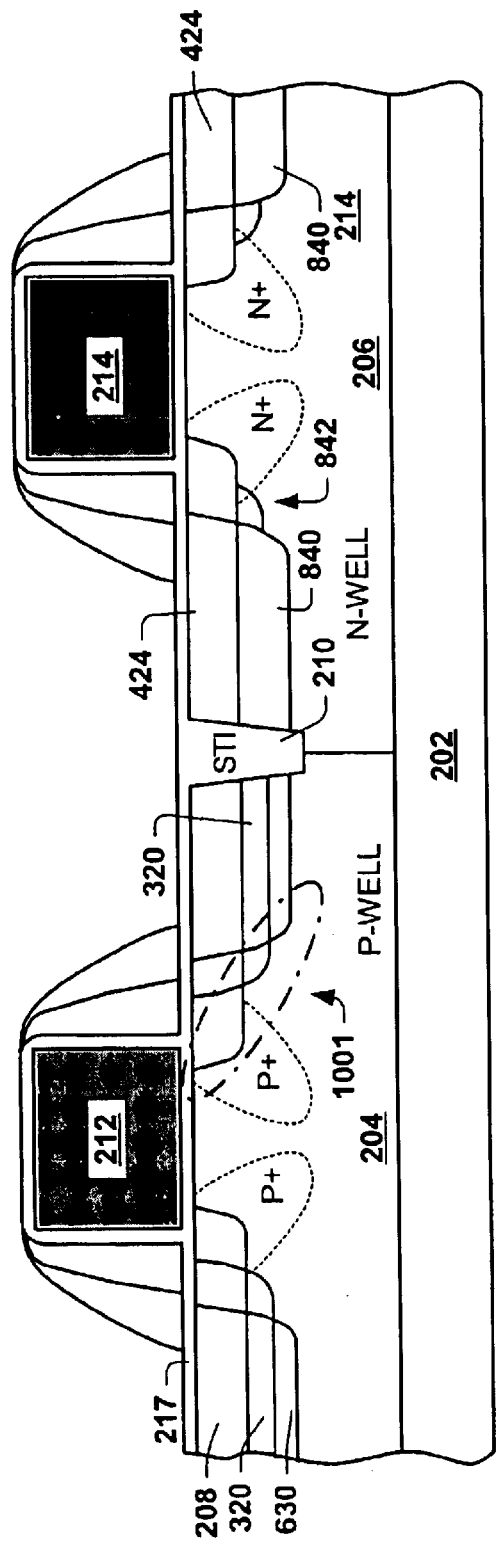
FIG. 10 is a diagram illustrating the semiconductor device in accordance with an aspect of the present invention.

FIG. 10 is a diagram illustrating the semiconductor device after completion of the method 100 in accordance with an aspect of the present invention. The device has the active region interface 1001 that has a relatively smooth dopant profile laterally from the HDD region 208 to the p-type HALO region 318. As a result, the NMOS transistor has relatively low standby leakage.

It is appreciated that the diagrams illustrated in FIGS. 2–10 are provided for exemplary purposes and are not necessarily drawn to scale. Furthermore, variation(s) in structure from that depicted are permitted and are in accordance with the present invention. Additionally, the NMOS region and the PMOS region, for simplicity of illustration, are described with respect to single transistors. However, it is appreciated that more than one transistor is generally present within each region.

Figure 11:
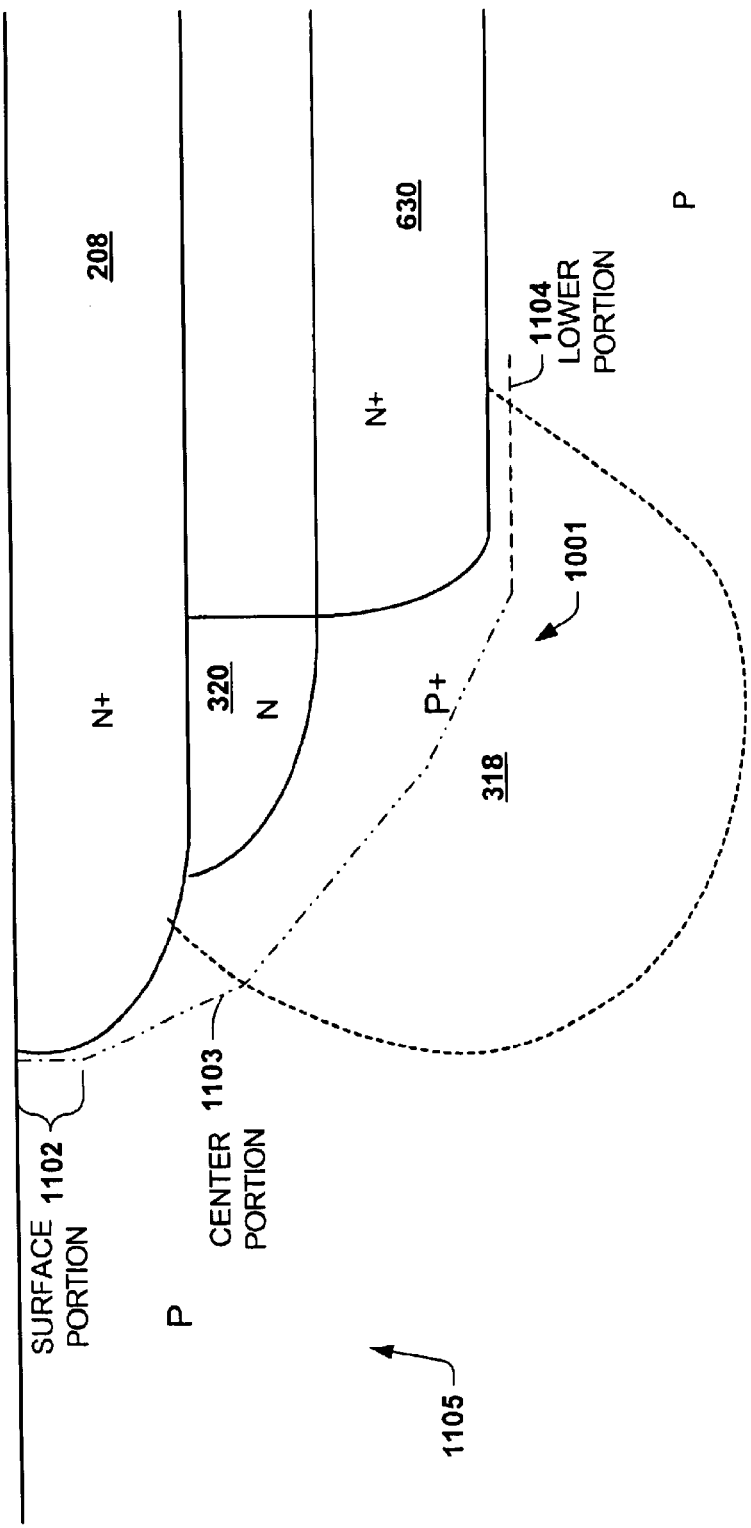
FIG. 11 is a diagram depicting a close up view of the active region interface in accordance with an aspect of the present invention.

FIG. 11 is a diagram depicting a close up view of the active region interface 1001 in accordance with an aspect of the present invention. This view depicts a surface portion 1102, a center portion 1103 and a lower portion 1104 of the active interface.

As stated previously, low standby leakage for CMOS transistors is comprised of several components including subthreshold current (Isub), gate edge drain leakage (Igdl), which includes gate induced drain leakage (Igidl) and drain to channel diode leakage, which is not controlled by gate voltage, and gate current (Igate). At relatively low leakage requirements, the gate edge drain leakage current becomes a significant portion of the total standby leakage. Thus, a significant reduction of the gate edge drain leakage can result in a significant reduction in standby leakage.

One of the factors affecting gate edge drain leakage is the sharpness of the active region to channel interface. As stated above, the sharpness is defined as a magnitude of change from one conductivity type to another at a portion of the active region to well or channel. Generally, the sharper the interface, the higher the e-field and therefore, the higher the gate induced drain leakage. Thus, smoothing or lowering the sharpness of a portion of the interface from the active region to the channel can reduce the gate induced drain leakage and, therefore, the standby leakage. However, in order to build short channel length devices, the drain extension to well interface should be sharp in order to reduce short channel effects.

The above can be accomplished by the method 100 of FIG. 1 by fabricating the active interface 1001 as shown in FIG. 11. The surface portion 1102 of the interface has a relatively sharp dopant transition. The length of the surface portion 1102 can be a suitable amount such as, but not limited to, 200 Angstroms. The center portion 1103 provides a relatively smooth transition (e.g., relatively low sharpness or magnitude of conductivity type change) from the N+ regions 208 and 630 to a channel region 1105. A dopant transition profile for the lower portion 1104 can vary upon implementation.

Figure 12:
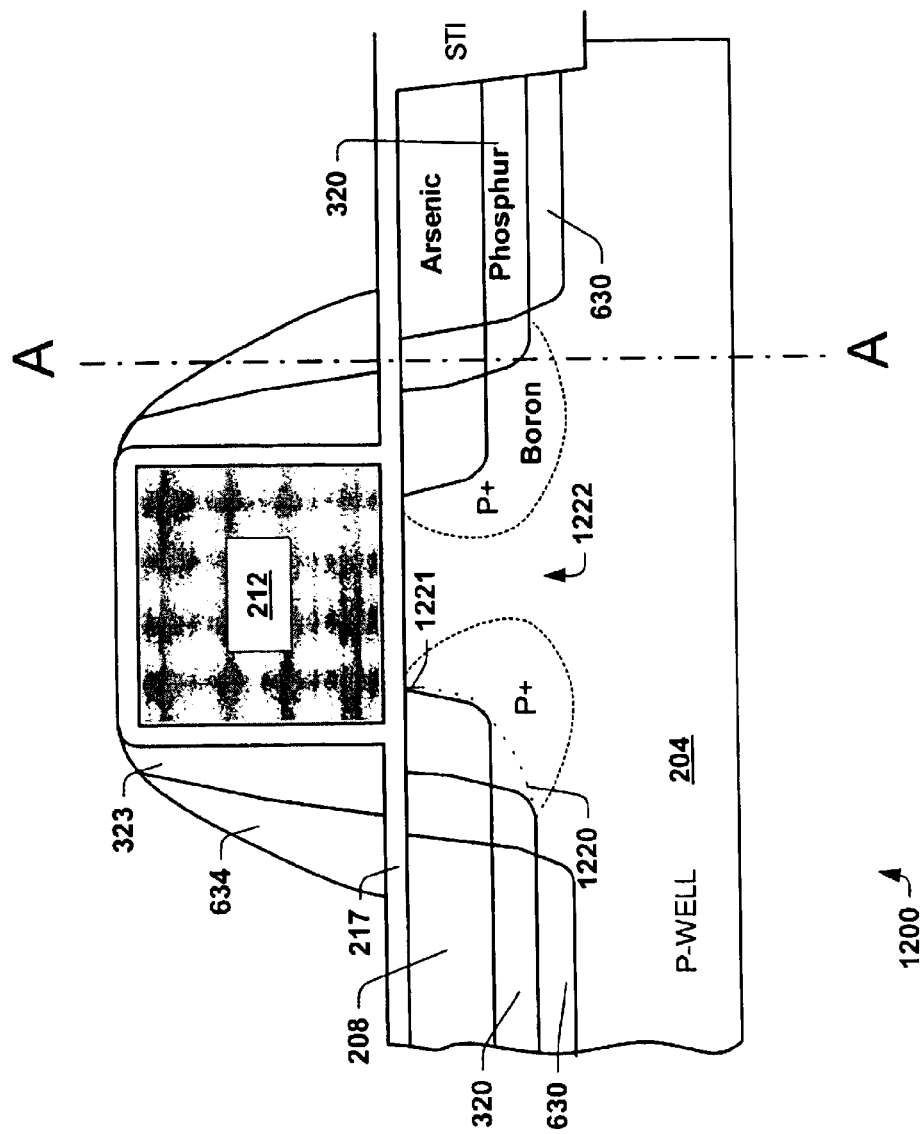
FIG. 12 is a diagram illustrating an exemplary NMOS transistor device in accordance with an aspect of the present invention.

FIG. 12 is a diagram illustrating an exemplary NMOS transistor device 1200 in accordance with an aspect of the present invention. The device 1200 is similar to portions of the device described with respect to FIGS. 1–11. Consequently, some details and descriptions of the device are omitted for brevity.

The device 1200 includes a p-type well 204. Active regions, including a HDD (highly doped drain) region 208, a second HDD region 320, and a deep source/drain region 630, are formed within the well 204. A liner oxide layer 217 is formed on a surface of the well 204 and a gate structure 212 is formed on/over the liner oxide 217. A p-type pocket or HALO region 318 is formed below and adjacent the HDD region 208 and the second HDD region 320 as illustrated.

The HDD region 208 includes arsenic as an n-type dopant (e.g., a dose of ~1×10$^{15}$ at 1–5 keV for arsenic). The second HDD region 320 includes phosphorous as another n-type dopant. The HALO region 320 includes boron as a p-type dopant. The phosphorous in the second HDD region 320 has been implanted at a relatively low energy, 6 keV and a dose of about 1×10$^{13}$. The HALO region 318 has been formed via a HALO implant process with boron.

The device 1200, as fabricated, has a relatively smooth dopant profile transition from the active regions (208, 320, and 630) through a central portion 1220 of an active interface to a channel region 1222. Consequently, the device has a relatively low gate edge drain leakage, which yields a relatively low standby leakage for the device. Additionally, as fabricated, the device 1200 has a relatively sharp dopant profile transition at a surface portion 1221 (e.g., about 200 Angstroms) of the active interface. As a result, short channel effects (SCE) can be at least partially mitigated thereby permitting greater scaling and a shorter channel length for the device 1200.

Figure 13:
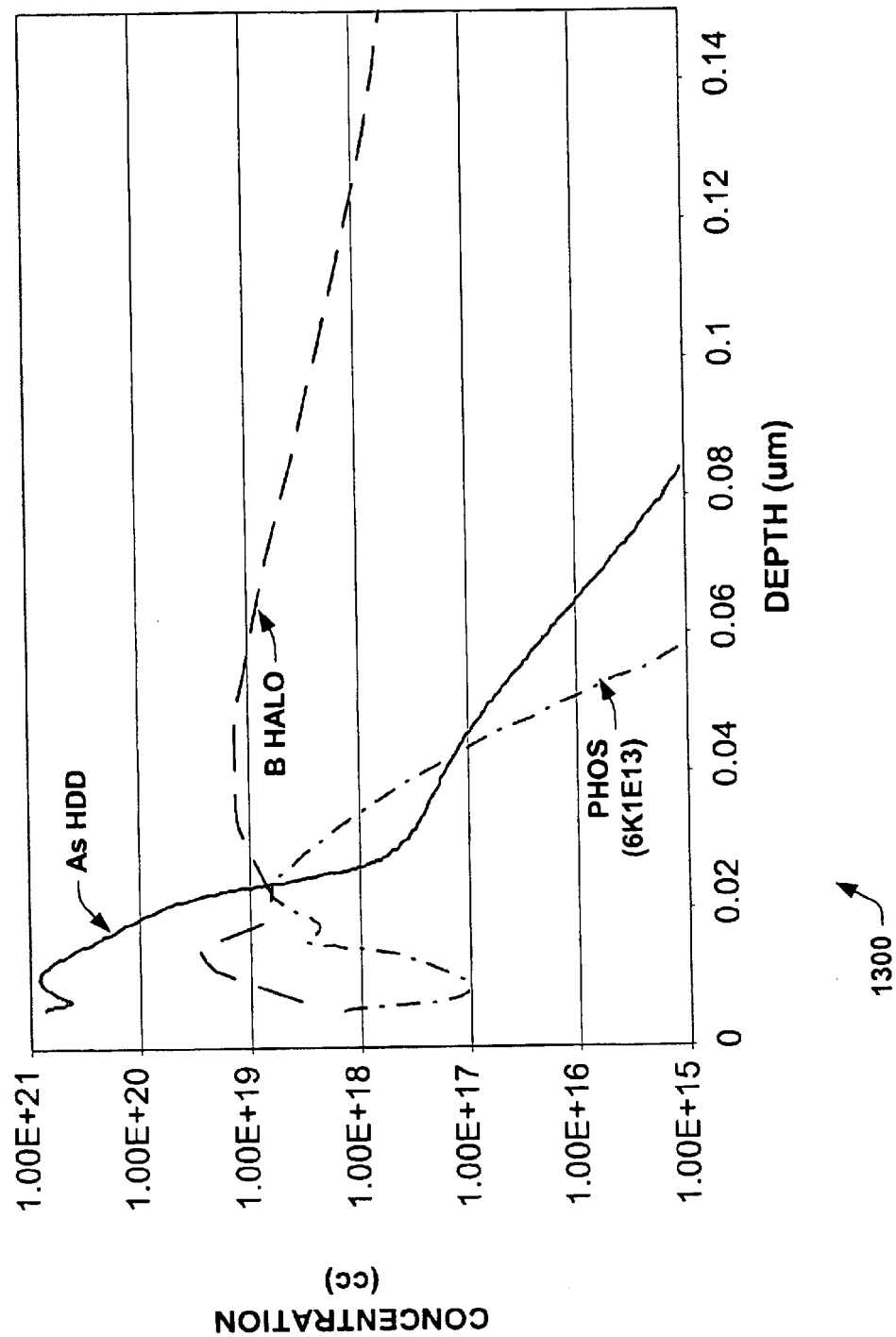
FIG. 13 is a graph that depicts exemplary dopant profiles of the exemplary device of FIG. 12.

Turning now to FIG. 13, a graph 1300 is provided that depicts dopant profiles throughout the line A—A of FIG. 12 in accordance with an aspect of the present invention. The graph 1300 illustrates dopant concentration on a y-axis and illustrates depth on an x-axis. The depth begins at an upper surface of the well 204 and extends through the HDD region 208, the second HDD region 320 and the HALO pocket 318.

From the graph 1300, it is noted that the phosphorous concentration reduces or counteracts the p-type conductivity of the boron thereby smoothing the dopant profile from the HDD region 208 to the HALO pocket 318. The phosphorous compensates out about 20 to 50% of the boron concentration within the HALO pocket 318. As a result, the gate induced drain leakage is lower because of this smooth dopant transition. Even relatively small dopant compensation by the phosphorous can lead to relatively large reductions in gate induced drain leakage. For example, 30% dopant compensation can result in a 10× reduction in the gate induced drain leakage.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A semiconductor device comprising:
   a first active region formed within a well;
   a second active region formed within the well;
   a channel region defined between the first active region and the second active region; and
   a first active region interface having a center portion defining an interface from the first active region to the channel region and having a lower portion defining an interface from the first active region to a lower portion of the well, wherein the center portion of the active region interface provides a relatively smooth dopant transition from the first active region to the channel region.

2. The device of claim 1, wherein the first active region and the second active region are of n-type conductivity and the well is of p-type conductivity.

3. The device of claim 1, wherein the well further comprises a first pocket region located adjacent to the first active region and a second pocket region located adjacent to the second active region, wherein the first pocket region and the second pocket region have a greater magnitude of conductivity than the well.

4. The device of claim 1, wherein the first active region comprises a highly doped drain region, an extension region, and a source/drain region.

5. The device of claim 1, wherein the active region interface further comprises a surface portion that provides a relatively sharp dopant transition from the first active region to the channel.

6. The device of claim 1, further comprising a gate structure formed over the channel region between the first active region and a second active region.

7. The device of claim 6, further comprising first sidewall spacers comprised of oxide formed adjacent to the gate structure.

8. The device of claim 7, further comprising second sidewall spacers comprised at least partially of nitride and formed adjacent to the first sidewall spacers and being thicker than the first sidewall spacers.

9. The device of claim 6, further comprising a liner oxide covering at least a portion of a surface of the device.

* * * * *